(12) United States Patent
McLean et al.

(10) Patent No.: US 6,749,766 B2
(45) Date of Patent: Jun. 15, 2004

(54) ETCHED METAL OXIDE FILM

(75) Inventors: Douglas McLean, Los Gatos, CA (US); Bernard Feldman, Watsonville, CA (US)

(73) Assignee: Feldman Technology Corporation, Watsonville, CA (US)

( * ) Notice: Subject to any disclaimer, the term of this patent is extended or adjusted under 35 U.S.C. 154(b) by 0 days.

(21) Appl. No.: 10/339,399

(22) Filed: Jan. 10, 2003

(65) Prior Publication Data

US 2003/0136755 A1 Jul. 24, 2003

Related U.S. Application Data

(63) Continuation of application No. 09/732,876, filed on Dec. 11, 2000, now abandoned, which is a division of application No. 09/421,232, filed on Oct. 20, 1999, now Pat. No. 6,180,021, which is a continuation-in-part of application No. 09/021,375, filed on Feb. 10, 1998, now Pat. No. 5,976,396.

(51) Int. Cl.[7] .................................................. C23F 1/00

(52) U.S. Cl. ........................ 216/101; 216/100; 216/108; 216/96; 428/702

(58) Field of Search ........................... 216/95, 96, 100, 216/101, 108; 257/449; 428/702

(56) References Cited

U.S. PATENT DOCUMENTS

| | | | |
|---|---|---|---|
| 3,551,304 A | 12/1970 | Letter et al. | ................. 205/118 |
| 3,668,089 A | 6/1972 | Chase et al. | .................. 216/95 |
| 4,232,059 A * | 11/1980 | Proffitt | ........................ 427/96 |
| 4,670,097 A | 6/1987 | Abdalla et al. | .......... 156/659.1 |
| 5,250,451 A | 10/1993 | Chouan | ........................ 437/40 |

FOREIGN PATENT DOCUMENTS

JP    4-69234    11/1995

* cited by examiner

*Primary Examiner*—Nadine G. Norton
*Assistant Examiner*—Shamim Ahmed
(74) *Attorney, Agent, or Firm*—Oblon, Spivak, McClelland, Maier & Neustadt, P.C.

(57) ABSTRACT

Metal oxide films are etched with a metal and an etch liquid containing an acid and a metal penetration control agent.

19 Claims, 2 Drawing Sheets

ETCHED METAL OXIDE FILM

This application as a continuation of application Ser. No. 09/732,876, filed on Dec. 11, 2000 abandoned, which is a Division of application Ser. No. 09/421,232 filed on Oct. 20, 1999, now U.S. Pat. No. 6,180,021, which is a Continuation-in-Part of application Ser. No. 09/021,375 filed on Feb. 10, 1998, now U.S. Pat. No. 5,976,396.

BACKGROUND OF THE INVENTION

1. Field of the Invention

The invention relates to a method for etching metal oxide thin films, particularly tin oxide films.

2. Discussion of the Background

Transparent Conductors are electrically conductive thin films, typically less than 1 micron thick, which transmit a substantial percentage of energy in the visible and/or solar bands of the electromagnetic spectrum. They are used in photovoltaic devices and most visual displays of both the emissive (light generating) and passive (light modifying) types. Transparent conductors consist mainly of two types:

1. Very thin metallic conductors (100–200 Å thick) such as silver and gold, and
2. Non-stoichiometric transparent conductive metal oxides (TCOs) optionally doped for enhanced conductivity.

Examples of TCOs include: Zinc Oxide, Indium Tin Oxide (ITO) and Tin Oxide (TO) which is $SnO_2$ optionally but preferably doped with fluorine. The current standard for many display applications is ITO, mainly because of its ease of etching at moderately elevated temperatures in strong acid or oxidizing solutions. TO is not readily chemically etched in the fine line patterns required for modern display and photovoltaic applications. In fact, for photovoltaic applications, current practice employs laser removal of the preferred TO film. This method is slow and expensive since the material is removed (vaporized) by serial progression of the laser head. Such methodology is totally inapplicable to display devices which may have thousands of lines or regions where the TCOs need to be removed to provide electrical isolation between conductive regions of the display. So, for display fabrication, the preferred process for configuring the required film patterns is to deposit the TCO on the entire surface of the substrate (usually glass), apply an etchant resist material (mask) to those portions of the TCO that it is desired to preserve, and remove or etch the unwanted material from the surface of the substrate.

TO has a number of advantages over competing TCO's for many applications:

1. Low cost. Indium is some 37 times more costly than $Tin_4$ ITO is applied in a sputtering chamber under clean room conditions. TO is applied at temperatures above 500° C. where few foreign particles survive, and may be applied on the float glass line as the glass is formed.
2. TO is very durable and less subject to damage during display fabrication. It may also be directly connected to most flat cable interconnects without additional metal deposits.
3. TO is electrically stable in the 500° C. range which is encountered in some important display fabrication environments.
4. TO forms cohesive bonds with the glass and/or alkali ion barrier layers, such as $SiO_2$ and $Al_2O_3$ deposited betwixt the substrate and the TO layers to prevent electrolytic decomposition of the TCO. This feature eliminates any concerns about TCO adhesion to the substrate.

For these and other reasons a low cost, reliable, production-prone process for etching TO is strongly desired in the art.

The etching of TO films with metallic zinc powder and hydrochloric acid (HCl) has a long history; typically the film is covered with the powdered metal, then immersed in a bath of acid. In an improvement to this procedure by Kato and Fukai (K/F), disclosed in Japanese Patent Publication 4-69234 (Nov. 5, 1992), incorporated herein by reference, ferric chloride ($FeCl_3$) is added to the acid bath. Other innovations encountered in a review of the prior art which are unrelated to our invention include the following, each of which have one or another defects which have prevented their generalized adoption.

1. U.S. Pat. No. 4,040,892, Sargent and Ghezzo (Aug. 9, 1977). The phosphosilicate glass mask and hot concentrated HI called for is not practical in a production environment.
2. U.S. Pat. No. 3,205,155 (Sep. 7, 1965), Van Natter. Safety and disposal problems associated with alkali metal in amalgam etching as well as high cost is the problem here.
3. U.S. Pat. No. 4,009,061 (Feb. 22, 1977), Simon. Chromium ($Cr^{++}$) does not reduce TO to Tin in any reasonable time frame.
4. U.S. Pat. No. 4,750,980, Hynecek et. al. (Jun. 14, 1988); U.S. Pat. No. 4,544,444, Chang (Oct. 1, 1985) U.S. Pat. No. 5,094,978, Miyagaki et. al. (May 6, 1992). These patents use plasma etching which is costly and too slow.

BRIEF DESCRIPTION OF THE FIGURES

FIG. 4 shows the preferred point (point 9) representing best choice (as determined by undercut, line definition and completeness of the etch) for our particular ≅3000 Å thick samples, supplied by AFG Industries Inc. as their product" "Comfort $E^{2}$"", the specifications of which are incorporated herein by reference. In finding the best point we were guided by the principle of approaching the lower right corner of our designated range (Box B of FIG. 4) as closely as possible consistent with the desired quality of the etch. Best points for other samples may differ, dependent on MO/TCO/TO thickness, mask adhesion, etc., but their determination will be within the skill of the ordinary artisan in view of the teaching herein. In FIG. 4 Box A shows the range of the K/F preferred embodiment. Box B shows our determination of the range for fine line etching of large samples. The point 10 shows the etch bath composition of unpatented, unpublished, undisclosed 1960's technology from entities, no longer existing, preceding Feldman Technology Corporation (FTC). Point 12 represents FTC's later trade secrete disclosure. The point X ($H^+$=0.8 M; $Fe^{+++}$=0.4 M) shows our best composition for a particular sample; it is included to illustrate the desirability of optimizing in the direction of the lower right corner of Box B, outside of Box A. Point 11 represents K/F's best reported result.

DESCRIPTION OF THE INVENTION

The following terms as used herein are defined as follows. Since TO is preferred, TCO includes TO and may be referred to as TCO/TO. Also, since the invention is applicable to etching a metal oxide (MO) which may be stoichiometric, and/or opaque and/or nonconductive, the term MO/TCO/TO applies to the most general case. Since our work was primarily conducted with TO, this term or TCO/TO is often used in the following description of the invention.

Sample: Refers to the sample being etched. It is typically a glass substrate covered with a MO, TCO, preferably TO film, typically up to 5000 Å thick, in turn covered by a mask which establishes a pattern to be etched in the MO/TCO/TO. After the MO/TCO/TO not covered by the masking material has been etched, the mask is removed. Most of the work described herein has been done with Shipley Microposit 1800 series photo-resists (the product brochures and MSD sheets of which are incorporated herein by reference). A variety of other masks including screen-printed, solid film and other photo-resists may also be used. A post-bake anneal at about 150° C. for 30 minutes enhances adhesion for most mask materials.

Figure 1:
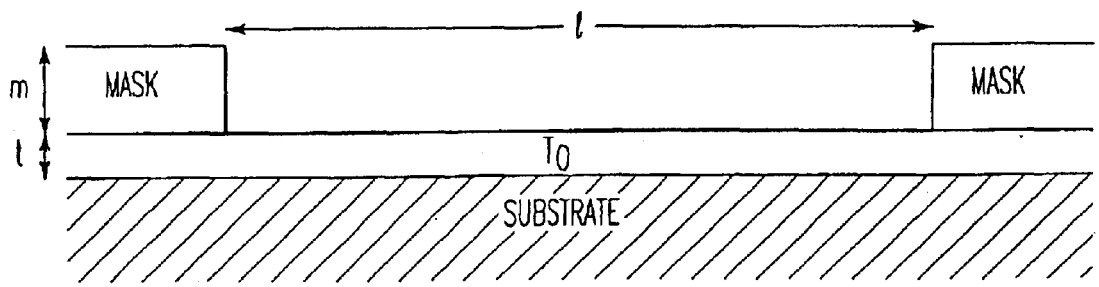
FIG. 1 shows a cross-section of a fine line masked pattern prior to etching.

Fine Line Etch: In a Fine Line Etch, features in the pattern being etched can be as small as can successfully be photo-printed. Experiments using the invention have provided features as small as 6 micron lines and spaces. Diagramatically, a cross section of a fine line before etching is shown in FIG. 1 where m~1–2 microns, t~0.3 microns and l~6 microns.

A condition for etching with Zn powder is that the Zn particle be in contact with the MO/TCO/TO; etching is observed to radiate from contact points. To picture the degree of contact note that commercially available Zn powder consists of irregularly shaped (~4 micron) particles.

Figure 2:
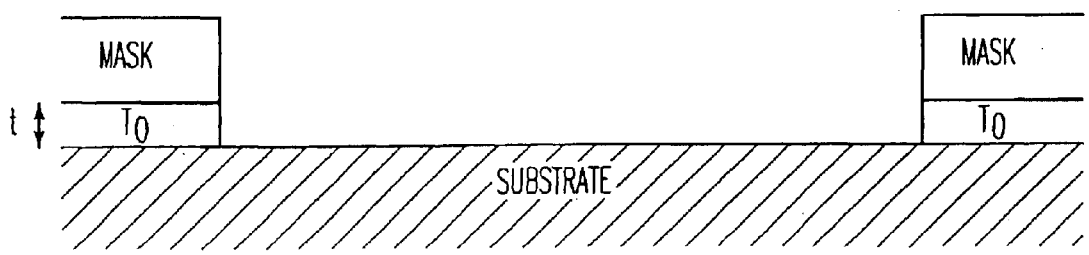
FIG. 2 is a cross-section of a fine line pattern showing a perfect etch.

A Perfect Etch: A Perfect Etch with final cross section is shown in FIG. 2.

Figure 3:
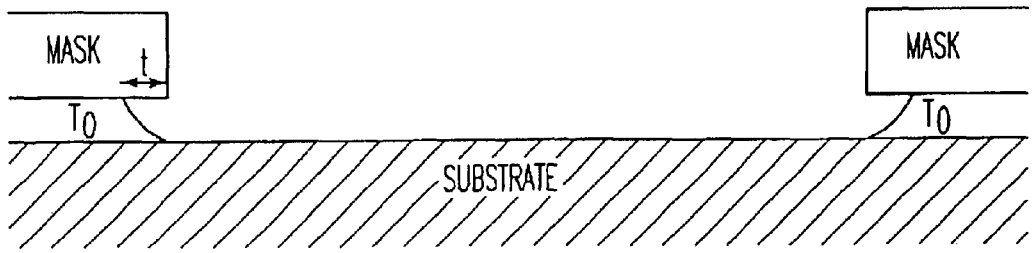
FIG. 3 shows a fine line etch pattern with a theoretical minimum undercut.

Perfect etch requires tight mask (resist) adhesion and no radiation of the etch under the mask. While tight mask adhesion can be realized, radiation of the etch under the mask can only be minimized. Optimally, if etching is terminated when points A in FIG. 2 are reached the MO/TCO/TO under the mask will be undercut up to a distance t, giving a line profile as shown in FIG. 3.

Theoretical Minimum Undercut: This is an etch where the undercut is $\leq t$ as shown in FIG. 3.

Perfect Line Definition: This is an etch that has uniform undercut over the entire pattern.

Excessive Undercut: a situation occurring when etching under the mask continues after unmasked areas have been etched down to the substrate.

Bad Line Definition: displayed when undercut is not uniform.

Complete Etch: An etch wherein unmasked TCO/TO has been etched down to the substrate over the entire sample.

Incomplete Etch: An etch wherein a thickness of unetched unmasked TCO/TO remains over the entire sample.

Patchwise Etch: An etch wherein the bulk of unmasked TCO/TO has been etched down to the substrate, but islands of incompletely etched TCO/TO remain.

Kato and Fukai (K/F) in Japan 4-69324, incorporated herein by reference, describe the original Zn—HCl procedure that their invention improves as follows: Zn powder is sprinkled onto a sample which is then immersed in a 10–20% (3.3–6.6 M $H^+$) HCl solution. K/F state that etching is initiated by the action of active (nascent) Hydrogen ($H^o$) produced from $Zn+H^+$, which reduces $Sn^{+4}$ in $SnO_2$ to metallic tin (Sn) at the exposed TO surface. They claim that the Sn dissolves in $H^+$ to produce more $H^o$, and thus the etch proceeds. In other words, the action of $Zn+H^+$ initiates the etch, the action of $Sn+H^+$ continues it to completion. They observe that the etch suffers from excessive undercut (the term used herein for what they call "side etching") and claim that the reason lies in the production of $H^o$ from dissolution of Sn under the mask. They argue that if the Sn under the mask is dissolved it can no longer be a source of excessive undercut. K/F's improvement is to add $FeCl_3$ to the etch bath to dissolve the Sn without $H^o$ evolution. In the preferred embodiment of their invention the sample is sprinkled with Zn powder, then immersed for 30 seconds in a bath containing HCl in a concentration range of 4–18 wt. % (1.3–5.8 M $H^+$) and $FeCl_3$ in the concentration range of 1–12 wt. % (0.04–1.03 M $Fe^{+++}$). Samples with a 1000 Å thick TO film with lines 30 microns in width and 20 mm long were etched with up to an order of magnitude reduction in undercut compared with that obtainable without the $FeCl_3$. In their best reported etch they observed a 2000 Å undercut at line edges (twice the Theoretical Minimum described under our Definitions) using an etch bath with 2.8 M $H^+$ and 0.8 M $Fe^{+++}$ In studying these phenomena we have determined that the chemistry described by K/F, both in regard to the original etch and their improvement on it, is wrong. In the etch without $FeCl_3$ we observe that, on the time scale of the etch, the dissolution of Sn by $H^+$ is inconsequential and therefore cannot be the source of $H^o$ either for the desired etch or the deleterious undercut. In fact, it is the $H^o$ from $Zn+H^+$ which is totally responsible for reducing TO to Sn, both in the original etch and the K/F improved etch. The difference lies in the nature of the reduced Sn. In the original etch it is loosely attached to underlying $SnO_2$ (it is easily rubbed off with a finger), has no sheen, is easily penetrable to $H^o$, making no barrier to the etching which radiates rapidly from Zn particle contact points with TO.

In the improved K/F etch the reduced Sn is quite different physically; it appears as a shiny film which cannot be rubbed off underlying TO, inhibiting penetration by $H^o$, slowing down the radiation of the etch. The improved K/F etch is more localized; a Sample, sparsely covered with Zn particles will be completely etched in the original Zn—HCl etch whereas it will be Patchwise Etched when $FeCl_3$ is added. More etch localization means less undercut. The fact that $Fe^{+++}$ dissolves Sn is not the primary reason for the improvement of the etch. The primary role of $Fe^{+++}$ is to provide a source of Ferrous ($Fe^{++}$) ions, and the $Fe^{++}$ ions, not the $Fe^{+++}$ ions, are responsible for change in the physical nature of reduced Sn.

Much of the concentration range in the preferred embodiment of the K/F invention cannot give a satisfactory Fine Line Etch. Especially, K/F's Samples are too small to demonstrate deficiencies of Patchwise Etch which, in practice, pose severe problems with large Samples (surface areas to greater than 1 $m^2$) of technological interest. Quantitatively, the Detailed Description of the Preferred Embodiments below shows the concentration ranges of the invention etch that, we find, can give a near optimum TO Fine Line Etch of large Samples (i.e. Samples having from 2 sq. in. to more than 1 sq. meter in surface area). Within the concentration ranges of the invention, the actual choices of concentrations, etc. should be tailored to the Sample, dependent on TO thickness, line width tolerances and mask adhesion, and is within the skill of the ordinary artisan in view of the teachings herein. Our experiments also show the desirability, for a given Sample, of finding a concentration choice for $Fe^{+++}$ of 0.2–0.5 M and a concentration of $H^+$ of 0.5–2 M.

Figure 4:
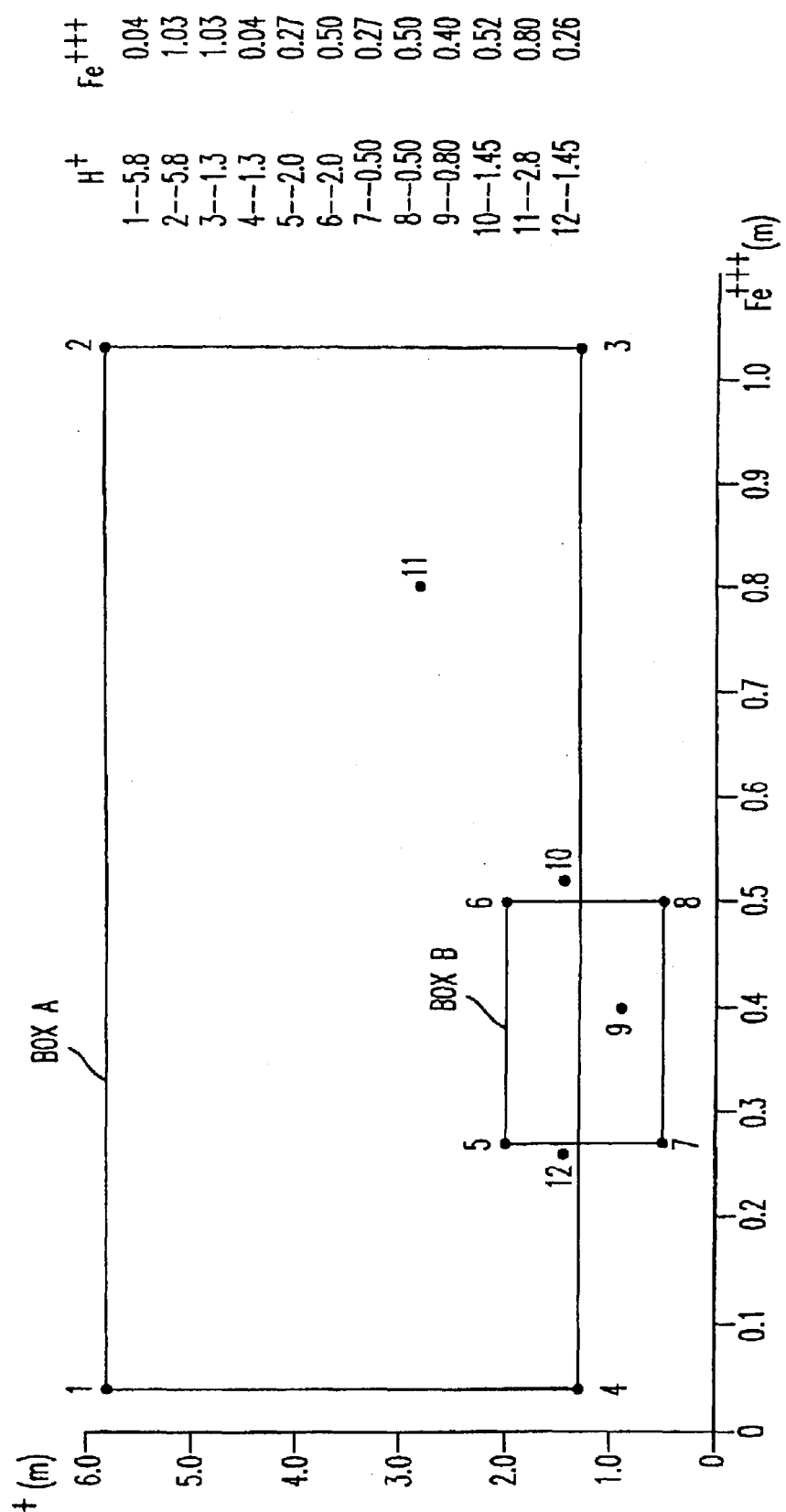
FIG. 4 shows preferred concentrations for an M-A-X etch.

For MAX etching according to the invention (see infra) concentrations are preferably defined by Box B in FIG. 4. More preferable $Fe^{+++}$ values are $\geq 0.27$ such as 0.28, 0.29, 0.30, etc. and $\leq 0.50$ such as 0.49, 0.48, 0.47, 0.46 and 0.45, etc. All values in Box B are specifically incorporated herein by reference.

Particularly preferred concentrations of $H^+$ (i.e., HCl) useful herein for MAX and other etching methods are 0.5, 0.6, 0.7, 0.8, 0.9, 1.0, 1.1, 1.2, less than 1.3, and 1.3–2.0 M. For MAX etching $H^+$ is preferably less than 1.4 M. All ranges between all stated values, and all values between stated values, are included. Particularly preferred X (e.g., $Fe^{+++}$ (i.e., $FeCl_3$)) concentrations useful herein are 0.2, 0.25, 0.3, 0.35, 0.4, 0.45, and 0.5 M including all values and ranges between stated values. For MAX etching X is preferably at least 0.27. more preferably 0.3 and greater. 0.8 M $H^+$ and 0.4 M $Fe^{+++}$ is particularly preferred. 1.4 M HCl and 0.25 M $FeCl_3$ is also useful. Preferred concentrations also include 0.3–0.5 M $Fe^{+++}$ used in conjunction with 0.5–1.2 M $H^+$. 1.45 M $H^+$ with 0.26 M $Fe^{+++}$ is preferably excluded for MAX etching as is 1.4 M $H^+$ with 0.52 M $Fe^{+++}$. MAX etching is useful for Fine Line Etching at all above concentrations including 1.3–2.0 M $H^+$ and 0.2–0.5 M $Fe^{+++}$. None of the above concentrations need be excluded for MAP or MAPX (see infra) etching, and all are included. Concentrations of P agent such as $Fe^{++}$ range from 0.01–1 M, including 0.1, 0.2, 0.3, 0.4, etc., M.

A key feature leading to the discovery of the present invention was the recognition that quality of the etch is governed by the physical characteristics of the reduced Sn, dependent on a specific component in the etch bath which we call the Penetration Control (P) agent. In the K/F etch, $Fe^{++}$ ions, produced in a reaction of $Fe^{+++}$ with Zn, act as the P agent. A second feature was the recognition of the role played by a second bath component, an oxidizing agent (X) that has the ability, in acid solution, to dissolve Sn; in the K/F etch, $Fe^{+++}$ ions are the X agent.

We discuss below four etch categories of wet etching technology for metal oxide films, with comments regarding preferred embodiments. Our discussion utilizes TO as an example although the results are applicable to other TCOs and metal oxide films.

1. M-A Etch: (A metal-acid etch with no P or X agent where M=metal and A=acid). The original Zn—HCl etch described by K/F is the most attractive implementation, although, in establishing the broad pattern described here, other electropositive metals and other acids are included.

2. M-A-X Etch: (an M-A etch bath is augmented with an oxidizing agent X). The X agent, in acid solution, can dissolve Sn (or other metal of a TCO or metal oxide film). We note that if X can dissolve Sn it inevitably reacts with a similar or more electropositive M. An example is the K/F etch in which M=Zn A=HCl and X=$FeCl_3$, with the inevitable reaction: $Zn+2Fe^{+++} \rightarrow 2Fe^{++}+Zn^{++}$, producing the $Fe^{++}$ ion which happens to be a powerful P (penetration control) agent. In a broader pattern, other choices for M, A, and X may be used. An essential feature of an M-A-X etch is that the introduction of a P agent, if at all, occurs in situ and is fortuitous. K/F, for example, did not recognize the existence of P agents and introduced $Fe^{+++}$ ions solely on account of their ability to dissolve Sn without producing $H°$, because they thought that a reaction of Sn with $H^+$ was producing $H°$ responsible for undercut.

3. M-A-P Etch: (an M-A bath is augmented by a P agent without an X agent requirement). For example, M=Zn, A=HCl, and P=$Fe^{++}$ (either of $FeSO_4$ and $FeCl_2$ are inexpensive sources). These are choices in one embodiment of our invention. In an M-A-P etch we have explicit control over the P agent, but must recognize that, for TO, when etching is complete there will be Sn trapped under the mask. This is easily dissolved in a second acid bath containing an X agent. Thus we separate the use of P and X agents with independent control over the actions of both. This separation opens up a wide range of P agents that can be used, no longer dependent on an M-X reaction. Useful concentrations of $Fe^{++}$ in the etch bath are 0.1, 0.2, 0.3, 0.4, 0.5, 0.6, 0.7, 0.8, 0.9, 1.0, 1.1, 1.2, 1.3, 1.4, and 1.5 M, inclusive of all values and subranges therebetween, preferably 0.1–1.5 M (e.g., $FeCl_2$, $FeSO_4$, etc.).

4. M-A-P-X Etch: (an M-A bath is augmented by controlled introduction of both P and X agents). Here we recognize that the inevitable M-X reaction can produce more of, or a different. P. In the case that: M=Zn, A=HCl, P=$Fe^{++}$ and X=$Fe^{+++}$, an M-A-P-X etch improves the comparable M-A-X etch because it offers an extra level of control over functions of the P and X agents.

Our invention is a consequence of studies conducted in all four categories of etch described above. Our inventions in the M-A-P and M-A-P-X range have no precedent. We also provide an invention in the M-A-X range which is outside the K/F technology.

DETAILED DESCRIPTION OF THE PREFERRED EMBODIMENTS

The present invention is best described by a detailed exposition of its various embodiments. For clarity, and because most of our work has been with M=Zn, P=$Fe^{++}$ and X=$Fe^{++}$, our discussion centers on these specific choices. The invention, however, is not limited to these choices. In addition, P may be $Ni^{++}$. Central issues are the procedure for bringing M (Zn) in contact with the TCO or metal oxide such as TO, and mechanisms of etch termination. (Recall that etching only occurs if M (Zn) is in physical contact with TCO/TO—albeit point-wise contact in view of the shape of the Zn particles—and that etching radiates through the body of the TCO/TO film from contact points.) M (Zn) particles can be brought to the sample before, after or at the same time as the etch liquid, or at two or more of these times. M particles can be applied to the Sample surface by painting, out of suspension, or by spraying. Given an etch mechanism of radiation from contact points, the process can be somewhat forgiving of non-uniformity—how forgiving is primarily dependent on the P agent ($Fe^{++}$) concentration, which controls the degree to which etching is localized around contact points. Uniformity of M on the surface of TCO/TO is preferred. Higher P/$Fe^{++}$ concentrations means tighter localization, demanding more uniformity in the spread. The degree of M (Zn) particle adhesion—to themselves, to TCO/TO, to the mask, and how etch liquid is introduced will affect M uniformity. A Sample may be immersed into a bath or the etch liquid can be sprayed on. If excess M is applied out of suspension, agitation of the sample in the bath provides effective uniform coverage. The best procedure depends upon the Sample, the production line, etc.

At this point we look at the four etch methods described above separately, paying particular attention to how etching terminates.

1. M-A Etching: When M=Zn, A=HCl, the etch radiates rapidly and extensively from Zn contact points because in this etch reduced Sn is easily penetrated by the $H°$ reducing agent, forming no barrier to continued etching. For this reason there is no satisfactory termination to the etch. Because Zn is in excess, etching will continue after the unmasked substrate is reached producing excessive undercut. Etching stops only when Zn contact ceases—either the Zn is used up (consumed by acid) or the sample is removed from the etchant and washed off. A Zn—HCl etch can be ruled out for fine-line etching.

2. M-A-X Etching: Dominant mechanisms when M=Zn, A=HCl, and X=$FeCl_3$ follow. At the sample surface Zn reacts with both $H^+$ and $Fe^{+++}$ producing $H^o$ and $Fe^{++}$ ions. This gives a surface concentration of $Fe^{++}$ ions which act as an effective penetration control (P) agent. This is essential to the success of the etch; indeed, $Fe^{+++}$ concentrations must be chosen on the basis of the surface concentrations of $Fe^{++}$ that they produce. (We note that Zn also reacts with $Fe^{++}$, reducing it to metallic Fe which coats the Zn particle—a reaction which may also be involved in producing the shiny film of Sn on the TO that acts as a barrier to further reduction). The reaction of Zn with $Fe^{+++}$ is vigorous and strongly exothermic—to the point that Zn particles can be lifted from the sample before the etching is complete. In fact, at high enough $Fe^{+++}$ concentrations the Zn will lift off the sample before any etching takes place at all. At somewhat lower $Fe^{+++}$ concentrations Zn lift-off can leave a Patchwise Etch. Optimized results require that the $Fe^{+++}$ concentrations be low enough to avoid a Patchwise Etch but high enough to control penetrability of Sn to $H^o$ to minimize undercut. When $X=Fe^{+++}$ these competing demands can be met successfully. As the etch proceeds, additional $Fe^{+++}$ ions dissolve reduced Sn, allowing further etching. Were it not for this reaction etching would stop when $H^o$ is unable to penetrate the built up layer of reduced Sn. The Sn dissolution reaction thus permits a complete etch provided that the pitfalls of premature Zn lift-off and Patchwise Etch are avoided. The etch termination mechanism is of considerable interest. When TO is etched down to the unmasked substrate, metallic Sn not yet dissolved by $Fe^{+++}$ flakes off, physically removing Zn particles from the sample. Zn particles still remaining at the sample are inhibited from causing serious undercut by a metallic Sn layer trapped under the mask. Thus, while excess Zn is still present after the desired etch is complete it is prevented from damaging the etch before being consumed by acid.

The importance of avoiding a Patchwise Etch must be emphasized—the situation where small incompletely etched islands of unmasked TO are surrounded by large areas etched down to the substrate. The remedy, of course, is a second etch; recoat the sample with Zn and reintroduce the etch liquid. But if Zn particles do not make contact with the small islands, and this is a real possibility, the islands will remain. Meanwhile, where the Zn contact is made with TO at the edge of mask lines, undercut and bad line definition ensues. To minimize this second problem it is important to leave any Sn trapped under the mask at the end of the first etch in place for the second etch.

What emerges is that a number of chemical reactions and physical effects must be kept in balance to complete a successful Fine-Line Etch of a large Sample with an M-A-X etch. Particular note is made of reliance on the M-X reaction in acid solution to produce an effective P agent. That good quality fine-line etches can be achieved with an appropriate range of $H^+$ and $Fe^{+++}$ concentrations in an M-A-X etch is remarkable although that range is quite restricted, invalidating all but a small peripheral range in the K/F preferred embodiment. K/F's invalid range falls prey to the conditions we have just discussed, namely no etching with very high concentrations because of Zn lift-off before the etch starts, Patchwise etching as concentrations are reduced and before they reach the valid range because of premature Zn lift-off or nonuniformity induced by too vigorous reaction, and excessive undercut with very low $Fe^{+++}$ concentrations because reduced Sn is too easily penetrated by $H^o$. FIG. 4 shows the point representing best choice (as determined by undercut, line definition and completeness of the etch) for our particular ≅3000 Å thick samples, supplied by AFG Industries Inc. as their product" "Comfort $E^{2}$"", the specifications of the which are incorporated herein by reference. In finding the best point we were guided by the principle of approaching the lower right corner (lowest concentrations of ingredients) of our designated range (Box B of FIG. 4) as closely as possible consistent with the desired quality of the etch. Best points for other samples may differ, dependent on MO/TCO/TO thickness, mask adhesion, etc., but their determination will be within the skill of the ordinary artisan in view of the teaching herein.

3. M-A-P-X: Our M-A-X studies with Zn, HCl and $FeCl_3$ have identified a $H^+$. $Fe^{+++}$ concentration range satisfactory for a good quality Fine Line Etch, with $Fe^{+++}$ concentrations of from ~0.5 M to lower values where line imperfections begin to appear, in order to avoid the Patchwise Etching that can result from excessively vigorous reaction of $Fe^{+++}$ with Zn at the surface. Our invention of the M-A-P-X method allows the etch to proceed with a low $Fe^{+++}$ ion concentration; no longer do we depend on the M-X reaction to produce a necessary concentration of $Fe^{++}$, its primary role in the M-A-X-method. In the M-A-P-X etch the desired $Fe^{++}$ is controlled by direct addition of a ferrous salt ($FeCl_2$ or $FeSO_4$) to the etch liquid. With this control the primary role of $Fe^{+++}$ is dissolution of the reduced Sn; its effect on the $Fe^{++}$ concentration is secondary. Since satisfactory Sn dissolution proceeds at lower $Fe^{+++}$ concentrations than is required in a M-A-X etch, the concentration range that induces premature Zn lift-off is easily avoided. 0.1, 0.2, 0.3, 0.4, 0.5, 0.6, 0.7, 0.8, 0.9, 1.0, 1.1, 1.2, 1.3, 1.4, 1.5, 1.6, 1.7, 1.8, 1.9, and 2.0 M A (e.g., $H^+$ as HCl, etc.), inclusive of all values and subranges therebetween, preferably 0.1–2.0 M A, is useful when a P agent is used.

One particularly effective implementation of an M-A-P-X etch which avoids premature Zn lift-off is described as follows:

A sample, pattern up, is covered to a depth of 2 mm. with an etchant solution consisting of 0.5 M $H^+$, 0.4 M $Fe^{++}$ and 0.1 M $Fe^{+++}$. Enough Zn to completely exhaust the etchant solution is added and the bath containing Sample, etchant solution and Zn agitated for approximately 60 seconds at which time all visual chemical activity ceases. The sample surface shows partial coverage of undissolved metallic tin which can be dissolved in a later step.

In this implementation, the concentration of P ($Fe^{++}$) increases with time into the etch due to reaction of $Fe^{+++}$ with Zn; thus penetrability to $H^o$ decreases with time. The concentration of $H^+$ is reduced with time due to the reaction with Zn forming $H^0$. $Fe^{+++}$ is dissolving metallic Sn at a rate slower than it is being formed, its concentration decreasing with time as it reacts with Zn slowing the rate even further. At the 60 second mark, $H^+$ and $Fe^{+++}$ have been completely exhausted; metallic Zn, metallic Sn and metallic Fe (from $Zn+Fe^{++}$) remain in the bath. The net effect of the balance of chemical reactions, and the change of that balance as the etch proceeds, is an etch with close to theoretical minimum undercut and close to perfect line definition. Moreover, it is a prescription oriented to quality controlled production since the etch starts with well defined concentrations, has a minimal physical effect on the mask and ends with a discardable or recyclable benign neutral solution.

4. M-A-P Etching: In the M-A-P method the etch liquid contains only acid and a penetration control agent; absence of the X agent means that Sn is not being dissolved. If the Sn is easily penetrated by the $H^o$, etching proceeds until all M is dissolved with resulting disastrous undercut in a Fine Line Etch, the fate of an M-A etch with Zn and HCl.

Since the P agent ($Fe^{++}$ or $Ni^{++}$, for example) controls penetrability, an M-A-P etch has the potential for building up Sn to the point of impenetrability. If this state is reached after unmasked TO is etched down to the substrate, a complete one-stage etch is achieved with undercut limited to the Sn under the mask. If the state of impenetrability occurs before unmasked TO is etched to the substrate, an incomplete etch is achieved; with $Fe^{++}$ or $Ni^{++}$ as the P agent all unmasked regions are covered by a layer of shiny Sn attached to underlying TO. In some applications this is a desired result representing an invention in its own right. In a preferred application it is an intermediate on the way to a complete etch. As an intermediate stage, when etching stops, the sample is removed from the etch bath, washed and put into a Sn dissolving (X) agent. (Acidified $FeCl_3$ is eminently satisfactory, but just one of many possibilities.) In an M-A-P etch we step through intermediate stages until the etch is complete.

The big advantage of an M-A-P etch is the controlled termination mechanism which avoids problems arising from Zn contact with the sample after TCO/TO is etched down to the substrate; in fact, procedures that keep the Zn contact after etching are advantageous because premature Zn lift-off responsible for Patchwise Etching is avoided. This argues for introducing Zn after, or at the same time as the sample is brought into contact with the etch liquid, rather than a Zn first process.

The separation of Sn dissolution from the etching step opens up many possibilities for etching liquids because competing chemical reactions that can affect the etch are reduced to a minimum. There is no longer the complication of the M-X reaction, most likely more vigorous than the reaction of M with A which produces $H°$, since X will be a more powerful oxidizing agent than $H°$. While the product of the M-X reaction may fortuitously produce an effective P agent at suitable concentration as in the $Zn$—$Fe^{+++}$ case, in general this will not be the case.

The M-A-P method may be at a disadvantage if thick TO films can only be etched in several steps. Then, in a production environment, if an M-A-X or an M-A-P-X etch can give the required quality, one of these methods may be preferred. At this point optimum choices are dependent on the production line technology. As in M-A-P-X etching, 0.1–2.0 M A (e.g., $H^+$ as HCl) can be used when P is present.

EXAMPLES

Here we describe examples of M-A-X, M-A-X-P and M-A-P etches with close to theoretical undercut and close to prefect line definition.

Materials:

An example of an etch liquid is a solution containing HCl (source: commercial 36.5 wt. % Muriatric Acid), $FeSO_4$ (source: 98+%), $FeSO_4.7H_2O$ crystals and $FeCl_3$ (source: commercial 42Be'). We describe the makeup of the solutions herein as $M(H^+)/M(Fe^{++})/M(Fe^{+++})$; i.e., M A/M P/M X; e.g., a 0.8/0.3/0.2 solution with molar concentrations 0.8, 0.3, and 0.2 of $H^+$, $Fe^{++}$ and $Fe^{+++}$ respectively is made by mixing 80 ml. of 36.5% muriatic acid, 83.4 g of $FeSO_4.7H_2O$ and 67 ml. of 42 Be' $FeCl_3$ and adding water to make 1 liter. An example of M-A-X etch bath (no P) would be written R/0/T where R=M $H^+$ and T=M X(e.g., $Fe^{+++}$).

When P=$Ni^{++}$, solutions are made by mixing the appropriate amounts of muriatic acid and, for example $NiCl_2.6H_2O$ to make solutions of the desired $H^+$ and $Ni^{++}$ concentrations.

An etch liquid, when it contains $Fe^{+++}$, can be used as an oxidizing bath; for example, a 1.0/0/0.5 etch liquid containing 1.0 M $H^+$, 0.5 M $Fe^{+++}$ will rapidly dissolve metallic tin.

Our reducing agent is powdered metallic Zn (Superfine-7 from U.S. Zinc Co. particle size: 4.1 microns).

Our samples use AFG Industries Comfort $E^2 \cong 3000$ Å TO film masked with Shipley Microposit 1800 series photoresists in a variety of patterns formed on a 15×15 cm. surface, with features, both masked and unmasked, down to 6 microns. Masked samples are baked at 150° C. for 30 minutes prior to etching. Photoresists are known in the art.

Example 1

M-A-X Etch (Painted Zinc)

A sample is covered by a thin layer of Zn particles by painting from a slurry of Zn powder in water, then dried. Under a microscope this shows as an approximately single layer of Zn particles not uniform on a 50 micron scale, but to the eye no regions are uncovered. The sample is lowered carefully, Zn up, into an 0.8/0/0.4 etch bath to a depth of ≅1 cm. or greater. A short (fraction of a second) delay is followed by vigorous reaction for several seconds; metallic tin flakes are seen to rise to the surface of the bath; activity at the sample surface ceases and dissolution of Zn and Sn lifted from the etch surface proceeds until all activity stops (in less than 2 minutes). The desired etch has been completed long before activity stops. The sample is lifted from the batch, washed and dried. Finally the mask is removed by dissolution in acetone.

Example 2

M-A-P-X Etch (Painted Zinc)

Proceed as in Example #1 using a 0.8/0.3/0.2 etch bath. Timing and observations are similar to those of Example #1 and the quality of the etch is marginally improved. The most important difference is that this 0.8/0.3/0.2 etch bath will avoid patchwise etch for a wider range of samples than the 0.8/0.3/0.4 bath used in Example 1.

Example 3

M-A-P-X Etch (Zinc Slurry)

A 15×15 cm. sample is laid, pattern up, into a flat tray of slightly larger dimensions and covered with 2 mm. of 0.5/0.4/0.1 etch liquid. Approximately 2 g. of powdered Zn is sprinkled onto the sample, through the liquid from an oversized salt shaker. The tray is agitated horizontally so that the Zn rolls this way and that over the sample surface giving, over time, uniform exposure of the surface to Zn. Metallic tin is seen forming on the surface, some staying, some peeling off. When activity ceases (in less than 2 min.) the liquid is nearly colorless (the characteristic red-brown color of $Fe^{+++}$ has disappeared) and some metal (metallic Zn, metallic Sn and metallic Fe) remains. In comparison with Examples 1 and 2 where the etch liquid is still active after dissolving all metal, in Example 3 the etch liquid is exhausted and metal remains, mostly as Zn particles coated with Fe, black in appearance as distinct from the gray uncoated particles, but also as Sn still attached to the surface especially at mask lines. The sample is removed from the tray, washed free of all Zn particles, immersed in an 1.0/0./0.5 oxidizing bath to dissolve Sn attached to the surface, washed again and dried. This Example 3 etch gives highest quality results with no danger of patchwise etch.

Example 4

M-A-P Etch (Zn Slurry)

Proceed as in Example 3, but use a 0.15/0.5/0.0 etch bath. In this case activity in the tray stops after partial etching.

Areas to be etched are covered by a metallic Sn film bonded to underlying TO not yet etched. After insertion and removal from an oxidizing bath the sample can be recycled through an identical series of steps and the recycling continued until etching is complete. Results are excellent; the example is given to demonstrate the possibility of controlling the etch to the point of producing potentially useful Sn layers on TO and to show how to separate the reduction and oxidization processes of the etch which are combined in M-A-X and M-A-P-X etches. This separation may prove necessary when using other than $Fe^{++}$ as a P agent, as we have already shown with $Cr^{++}$ and $Cr^{+++}$ ions.

Example 5

MAP Etch of a 3000 Angstrom TO Film Using a Slurry with $P=Ni^{++}$

This etch is designed to be complete in a single step. An etch liquid with $H^+$ and $Ni^{++}$ molar concentrations of 0.75 and 0.015, respectively, is added to fine metallic Zinc particles (<4.1 micron) and made into a slurry which is immediately spread uniformly over the masked surface to be etched and gently agitated to move the Zinc particles to and fro. (Slurry proportions can be optimized from a starting point of 7 grams of Zinc and 85 milliliters of etch liquid per square foot of sample surface.) At room temperature, flakes of metallic Tin will detach from areas of the sample which are not confined by close (less than around 500 microns) mask areas or lines in around 30 seconds. In confined areas, especially with fine featured masks (feature dimensions less than around 50 microns) metallic Tin appears but will not detach from the substrate even when the etch is complete. The etch terminates when the acid is exhausted, leaving excess Zinc. The sample is washed thoroughly to remove any Zinc particles from the surface, then immersed in an oxidizing bath (see previous Examples) to dissolve metallic Tin still adhering to the substrate, washed again, and dried.

Other metals, alone or in combination, can replace Zn in this invention. Al and Mg are preferred candidates. $H_2SO_4$ is useful as a replacement acid. The acid (A) used herein is a strong acid that is essentially completely dissociated in water (e.g., HCl, $H_2SO_4$). Acids that are also oxidizing agents can also be used but must be evaluated for additional, possibly deleterious, reactions in the etching stage. Other P agents include transition metal ions such as chromium and nickel ions; however, the action of the P agent is not presently understood at any fundamental level. We have shown that $Ni^{++}$, $Cr^{++}$ and $Cr^{+++}$ ions can be used. For X agents when used in an M-A-P etch where dissolving Sn is carried out in a separate bath, any oxidizing solution in an acid bath will work—dichromate, permanganate, etc.

The following embodiments A–T are within the skill of the ordinary artisan in view of the teachings herein, and are preferred embodiments of the invention:

A. The M-A-X method of etching fine line samples of masked metal oxide films in which a metal (M) and an etch liquid composed of an acid (A) and a metal dissolution agent (X) are brought into contact with the sample; in which the metal oxide is reduced to its metallic form through the action of active Hydrogen ($H^°$) produced in the reaction of M with A and in which the additional reaction of M with X produces an agent that controls the penetrability of the reduced metal oxide metal to $H^°$ in order to control undercut (etching under the mask).

B. The method of Embodiment A wherein the metal oxide is tin oxide, the metal, M, is zinc and the etch liquid is composed of Hydrochloric Acid (HCl) in the concentration range 0.5–1.5 M $H^+$, including 0.5, 0.6, 0.7, 0.8, 0.9, 1.0, 1.1, 1.2, 1.3, 1.4 and 1.5 M $H^+$, inclusive of all values and subranges therebetween, and Ferric Chloride ($FeCl_3$) in the range 0.2–0.5 M $Fe^{+++}$, including 0.2, 0.25, 0.3, 0.35, 0.4, 0.45, and 0.5 M $Fe^{+++}$, inclusive of all values and subranges therebetween. Optimum concentrations can be tailored to the properties of the sample whereby the concentration of $Fe^{++}$ at the surface, generated in the reaction of Zn with $Fe^{+++}$, reaches the highest value possible before patchwise etching occurs.

C. The M-A-P-X method of etching samples such as fine-line samples of masked metal oxide films in which a metal (M) and an etch liquid composed of an acid (A), a penetration control agent (P) and a metal dissolution agent (X) are brought into contact with the sample; in which the metal oxide is reduced to its metallic form through the action of active Hydrogen ($H^°$) produced in the reaction of M with A, in which the penetrability of the reduced metal oxide metal to $H^°$ is controlled by the concentration of P and in which the primary function of X is to dissolve the reduced metal oxide metal.

D. The method of Embodiment C wherein the metal oxide is tin oxide, the metal (M) is zinc and the etch liquid is made from Hydrochloric Acid (HCl) in the concentration range 0.4–1.5 M $H^+$, including 0.4, 0.5, 0.6, 0.7, 0.8, 0.9, 1.0, 1.1, 1.2, 1.3, 1.4, and 1.5 M $H^+$, inclusive of all values and subranges therebetween, and Ferrous Chloride ($FeCl_2$) and/or Ferrous Sulfate ($FeSO_4$) in the concentration range 0.2–1.0 M $Fe^{++}$, including 0.2, 0.3, 0.4, 0.5, 0.6, 0.7, 0.8, 0.9, and 1.0 M $Fe^{+++}$, inclusive of all values and subranges therebetween, and Ferric Chloride in the concentration range 0.01–0.4 M $Fe^{+++}$, including 0.01, 0.05, 0.1, 0.15, 0.2, 0.25, 0.3, 0.35, and 0.4 M $Fe^{+++}$, inclusive of all values and subranges therebetween. Optimization of the concentration ranges are tailored to the properties of the sample whereby the $Fe^{+++}$ concentration is as low as possible consistent with a one stage etch in a desired time.

E. The M-A-P method of etching samples such as fine-line samples of masked metal oxides in which a metal (M) and an etch liquid composed of an acid (A) and a reduced metal oxide metal penetration control agent, (P) are brought into contact with the sample; in which the metal oxide is reduced to its metallic form through the action of active Hydrogen ($H^°$) produced in the reaction of M with A, and in which etching stops when the reduced metal oxide metal becomes impenetrable to $H^°$.

F. The method of Embodiment E wherein the metal oxide is tin oxide, the metal (M) is Zinc and the etch liquid is made from Hydrochloric Acid (HCl) in the concentration range 0.1–1.5 M $H^+$, including 0.1, 0.2, 0.3, 0.4, 0.5, 0.6, 0.7, 0.8, 0.9, 1.0, 1.1, 1.2, 1.3, 1.4, and 1.5 M $H^+$, inclusive of all values and subranges therebetween, and Ferrous Chloride ($FeCl_2$) or Ferrous Sulfate ($FeSO_4$) in the concentration range 0.3–1.0 M $Fe^{++}$, including 0.3, 0.4, 0.5. 0.6, 0.7, 0.8, 0.9, and 1.0 M $Fe^{++}$, inclusive of all values and subranges therebetween. Optimum concentrations may be selected consistent with a desired thickness of TO to be etched. In an incomplete etch a layer of reduced tin bonded to the unetched unmasked TO results.

G. The method of Embodiment F with the substitution of an etch liquid made from Hydrochloric Acid (HCl) in the concentration range 0.1–2.0 M $H^+$, including 0.1, 0.2, 0.3, 0.4, 0.5, 0.6, 0.7, 0.8, 0.9, 1.0, 1.1, 1.2, 1.3, 1.4, 1.5, 1.6, 1.7, 1.8, 1.9, and 2.0 M $H^+$, inclusive of all values and subranges therebetween, and Nickel Chloride ($NiCl_2$) in the concentration range 0.001–0.2 M $Ni^{++}$, including 0.001, 0.002, 0.003, 0.004, 0.005, 0.006, 0.007, 0.008, 0.009, 0.01, 0.011, 0.012, 0.013, 0.014, 0.015, 0.016, 0.017, 0.018, 0.019, 0.02, 0.03, 0.04, 0.05, 0.06, 0.07, 0.08, 0.09, 0.10, 0.11, 0.12, 0.13, 0.14, 0.15, 0.16, 0.17, 0.18, 0.19, and 0.20 M $Ni^{++}$, inclusive of all values and subranges therebetween.

H. The method of Embodiment F with the substitution of an etch liquid made from Hydrochloric Acid (HCl) in the concentration range 0.1–1.0 M H, including 0.1, 0.2, 0.3, 0.4, 0.5, 0.6, 0.7, 0.8, 0.9, and 1.0 M $H^+$, inclusive of all values and subranges therebetween and Chromous Chloride ($CrCl_2$) and/or Chromic Chloride ($CrCl_3$) in concentration range 0.1–0.5 M $Cr^{++}$ and/or $Cr^{+++}$, including 0.1, 0.2, 0.3, 0.4, and 0.5 M $Cr^{++}$ and/or $Cr^{+++}$, inclusive of all values and subranges therebetween (Because of reactions with Zn and $H^+$ a dynamic balance of actual $Cr^{++}$ and $Cr^{+++}$ concentrations is established during the etch).

I. The method of Embodiments E–H in which the reduced metal oxide metal is dissolved from the sample in an acid bath containing an appropriate oxidizing agent.

J. The application of methods in Embodiments E–I to progressively etch films of metal oxide too thick to etch in a single stage.

Further preferred embodiments of the invention, all of which are within the skill of the ordinary artisan in view of our teachings, are:

K. A method of etching a masked metal oxide film in which a metal (M) and an etch liquid comprising an acid (A) and a metal dissolution agent (X) are brought into contact with the metal oxide film, wherein the concentration of acid in said etch liquid is 0.5–2.0 M $H^+$, including 0.5, 0.6, 0.7, 0.8, 0.9, 1.0, 1.1, 1.2, 1.3, 1.4, 1.5, 1.6, 1.7, 1.8, 1.9, and 2.0 M $H^+$, inclusive of all values and subranges therebetween, and the concentration of said metal dissolution agent is 0.3–0.45 M, including 0.3, 0.31, 0.32, 0.33, 0.34, 0.35, 0.36, 0.37, 0.38, 0.39, 0.40, 0.41, 0.42, 0.43, 0.44, and 0.45 M, inclusive of all values and subranges therebetween, where A is $H^+$, X is $Fe^{+++}$ and M is Zn.

L. The method of Embodiment K, wherein the metal oxide is tin oxide, the metal, M, is zinc and the etch liquid comprises hydrochloric acid (HCl) in a concentration of 0.7–1.0 M, including 0.7, 0.8, 0.9, and 1.0 M, inclusive of all values and subranges therebetween, and ferric chloride ($FeCl_3$) in a concentration of 0.3–0.4 M, including 0.31, 0.32, 0.33, 0.34, 0.35, 0.36, 0.37, 0.38, 0.39, and 0.4 M, inclusive of all values and subranges therebetween.

M. The method of embodiment K, wherein the concentration of acid in said etch liquid is 0.5–1.0 M $H^+$, including 0.5, 0.6, 0.7, 0.8, 0.9, and 1.0 M $H^+$, inclusive of all values and subranges therebetween, and the concentration of said metal dissolution agent is 0.35–0.45 M, including 0.35, 0.36, 0.37, 0.38, 0.39, 0.40, 0.41, 0.42, 0.43, 0.44, and 0.45 M, inclusive of all values and subranges therebetween.

N. A method of etching a masked metal oxide film in which a metal (M) and an etch liquid comprising an acid (A), a penetration control agent (P) and a metal dissolution agent (X) are brought into contact with the metal oxide film, wherein said etch liquid comprises 0.1–2.0 M A, including 0.1, 0.2, 0.3, 0.4, 0.5, 0.6, 0.7, 0.8, 0.9, 1.0, 1.1, 1.2, 1.3, 1.4, 1.5, 1.6, 1.7, 1.8, 1.9, and 2.0 M A, inclusive of all values and subranges therebetween, 0.1–1.5 M P, including 0.1, 0.2, 0.3, 0.4, 0.5, 0.6, 0.7, 0.8, 0.9, 1.0, 1.1, 1.2, 1.3, 1.4, and 1.5 M P, inclusive of all values and subranges therebetween, and 0.1–0.5 M X, including 0.1, 0.2, 0.3, 0.4, 0.5, M X, inclusive of all values and subranges therebetween, where A is $H^+$, P is $Fe^{++}$, X is $Fe^{+++}$, and M is Zn.

O. The method of Embodiment N, wherein the metal oxide is tin oxide, the metal (M) is zinc and the etch liquid comprises hydrochloric acid (HCl) in a concentration of 0.6–1.0 M $H^+$, including 0.6, 0.7, 0.8, 0.9, and 1.0 M $H^+$, inclusive of all values and subranges therebetween, ferrous chloride ($FeCl_2$) and/or ferrous sulfate ($FeSO_4$) in a total concentration of 0.4–1.0 M $Fe^{++}$, including 0.4, 0.5, 0.6, 0.7, 0.8, 0.9, and 1.0 M $Fe^{++}$, inclusive of all values and subranges therebetween, and ferric chloride in a concentration of 0.1–0.4 M $Fe^{+++}$ including 0.1, 0.2, 0.3, and 0.4 M $Fe^{+++}$, inclusive of all values and subranges therebetween.

P. A method of etching a masked metal oxide film in which a metal (M) and an etch liquid comprising an acid (A) and a penetration control agent, (P) are brought into contact with the metal oxide film, wherein said etch liquid comprises 0.1–2 M A, including 0.1, 0.2, 0.3, 0.4, 0.5, 0.6, 0.7, 0.8, 0.9, 1.0, 1.1, 1.2, 1.3, 1.4, 1.5, 1.6, 1.7, 1.8, 1.9, and 2.0 M A, inclusive of all values and subranges therebetween, and 0.1–1.5 M P, including 0.1, 0.2, 0.3, 0.4, 0.5, 0.6, 0.7, 0.8, 0.9, 1.0, 1.1, 1.2, 1.3, 1.4, and 1.5 M $P^+$, inclusive of all values and subranges therebetween, where M is Zn, A is $H^+$ and P is $Fe^{++}$.

Q. The method of Embodiment P, wherein the metal oxide is tin oxide, the metal (M) is zinc and the etch liquid comprises hydrochloric acid (HCl) in a concentration of 0.2–1.0 M $H^+$, including 0.2, 0.3, 0.4, 0.5, 0.6, 0.7, 0.8, 0.9, and 1.0 M $H^+$, inclusive of all values and subranges therebetween, and ferrous chloride ($FeCl_2$) and/or ferrous sulfate ($FeSO_4$) in a total concentration range of 0.3–1.0 M $Fe^{++}$, including 0.3, 0.4, 0.5, 0.6, 0.7, 0.8, 0.9, and 1.0 M $Fe^{++}$, inclusive of all values and subranges therebetween.

R. The method of Embodiment P, wherein said etch liquid comprises hydrochloric acid (HCl) in a concentration of 0.1–1.0 M $H^+$, including 0.1, 0.2, 0.3, 0.4, 0.5, 0.6, 0.7, 0.8, 0.9. and 1.0 M $H^+$, inclusive of all values and subranges therebetween, and chromous chloride ($CrCl_2$) and/or chromic chloride ($CrCl_3$) in total concentration of 0.1–0.5 M $Cr^{+++}$, including 0.1, 0.2, 0.3, 0.4, and 0.5 M $Cr^{+++}$, inclusive of all values and subranges therebetween.

S. The method of Embodiment P, further comprising dissolving reduced metal oxide in an oxidizing bath.

T. The method of Embodiment P, wherein said method is applied successively to a metal oxide film.

In the invention etch baths are preferably aqueous, and metal oxide-coated samples are preferably at least one square inch in area, more preferably larger. Preferred undercuts approach the thickness t of the film being etched, and include 3t, 2t, <2t, 1.5t, 1.2t, 1.1t, 1.05t, 1.01t, etc. In carrying out etching the metal can be contacted with the MO film before, simultaneously with, and/or after the MO comes in contact with the etch liquid (immersion, spraying, etc.).

U.S. application serial no. 21,375, filed Feb. 10, 1998, is incorporated herein by reference.

It is to be understood that various modifications of the appended claims will be apparent to skilled practitioners and it is intended to cover such modifications as fall within the spirit of the those claims.

What is claimed as new and desired to be secured by Letters Patent of the United States is:

1. An etched metal oxide film prepared by a method comprising:

contacting a masked metal oxide film comprising a metal (M) on a substrate with a etch liquid comprising an acid (A) and a $Ni^{++}$ reduced metal oxide metal penetration control agent (P), thereby producing active hydrogen ($H^0$) from the reaction of M with A;

wherein the metal oxide is reduced to its metallic form through the action of $H^0$ and etching stops when the reduced metal oxide becomes impenetrable to $H^0$.

2. The etched metal oxide film of claim 1, wherein the metal oxide film is a tin oxide film.

3. The etched metal oxide film of claim 1, wherein the metal (M) comprises Zn.

4. The etched metal oxide film of claim 1, wherein the acid (A) comprises HCl.

5. The etched metal oxide film of claim 4, wherein the acid (A) has a concentration of 0.1 to 2.0 M $H^+$.

6. The etched metal oxide film of claim 4, wherein the acid (A) has a concentration of 0.1 to 1.5 M $H^+$.

7. The etched metal oxide film of claim 1, wherein the metal oxide metal penetration control agent (P) comprises $NiCl_2$.

8. The etched metal oxide film of claim 7, wherein the metal oxide metal penetration control agent (P) has a concentration of 0.001 to 0.2 M $Ni^{++}$.

9. The etched metal oxide film of claim 7, wherein the metal oxide metal penetration control agent (P) has a concentration of 0.003 to 0.02 M $Ni^{++}$.

10. The etched metal oxide film of claim 1, wherein said method further comprises dissolving said reduced metal oxide in an acid bath containing an oxidizing agent.

11. The etched metal oxide film of claim 2, wherein said method further comprises dissolving said reduced metal oxide in an acid bath containing an oxidizing agent.

12. The etched metal oxide film of claim 1, wherein the acid (A) comprises HCl having a concentration of 0.1 to 2.0 M $H^+$ and the metal oxide metal penetration control agent (P) comprises $NiCl_2$ having a concentration of 0.001 to 0.2 M $Ni^{++}$.

13. The etched metal oxide film of claim 2, wherein the acid (A) comprises HCl having a concentration of 0.1 to 2.0 M $H^+$ and the metal oxide metal penetration control agent (P) comprises $NiCl_2$ having a concentration of 0.001 to 0.2 M $Ni^{++}$.

14. The etched metal oxide film of claim 1, wherein the acid (A) comprises HCl having a concentration of 0.1 to 1.5 M $H^+$ and the metal oxide metal penetration control agent (P) comprises $NiCl_2$ having a concentration of 0.003 to 0.02 M $Ni^{++}$.

15. The etched metal oxide film of claim 2, wherein the acid (A) comprises HCl having a concentration of 0.1 to 1.5 M $H^+$ and the metal oxide metal penetration control agent (P) comprises $NiCl_2$ having a concentration of 0.003 to 0.02 M $Ni^{++}$.

16. The etched metal oxide film of claim 1, wherein said contacting is carried out at least two times.

17. The etched metal oxide film of claim 2, wherein said contacting is carried out at least two times.

18. The etched metal oxide film of claim 1, wherein said etch liquid further comprises a slurry of said metal (M).

19. The etched metal oxide film of claim 1, wherein the etched metal oxide film comprises a layer of the reduced metal oxide.

* * * * *